United States Patent
Schober

(10) Patent No.: US 10,175,305 B2
(45) Date of Patent: Jan. 8, 2019

(54) MAGNETIC FIELD SENSOR WITH A ELECTRICAL CONTACT ELEMENT HAVING A UNDERCUT SECTION, MODULE WITH THE MAGNETIC FIELD SENSOR AND METHOD TO MANUFACTURE THE MODULE WITH THE MAGNETIC FIELD SENSOR

(71) Applicant: ZF Friedrichshafen AG, Friedrichshafen (DE)

(72) Inventor: Thomas Schober, Hahnbach (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 89 days.

(21) Appl. No.: 15/429,729

(22) Filed: Feb. 10, 2017

(65) Prior Publication Data
US 2017/0234939 A1 Aug. 17, 2017

(30) Foreign Application Priority Data
Feb. 12, 2016 (DE) .......... 10 2016 202 192

(51) Int. Cl.
*G01R 33/07* (2006.01)
*G01R 33/00* (2006.01)
*G01D 11/24* (2006.01)

(52) U.S. Cl.
CPC ....... *G01R 33/0047* (2013.01); *G01D 11/245* (2013.01); *G01R 33/0052* (2013.01); *G01R 33/07* (2013.01)

(58) Field of Classification Search
CPC .............. G01R 33/0047; G01R 33/07; G01R 33/0052; G01R 33/06; G01R 33/072;
(Continued)

(56) References Cited

U.S. PATENT DOCUMENTS 5,017,866 A * 5/1991 Santos .................... F16C 19/30
  324/174
6,373,241 B1 * 4/2002 Weber .................... G01D 5/145
  310/68 B (Continued)

FOREIGN PATENT DOCUMENTS

DE 10 2008 064 047 A1 4/2010
DE 10 2011 081 222 A1 2/2013

OTHER PUBLICATIONS

German Office Action dated Jul. 19, 2016 for DE 10 2016 202 192.3 (German language, 8 pages).

(Continued)

*Primary Examiner* — Jermele M Hollington
*Assistant Examiner* — Taqi Nasir
(74) *Attorney, Agent, or Firm* — Brinks Gilson & Lione

(57) ABSTRACT

Magnetic field sensor having a magnetic field sensor element and at least a band-shaped electrical contact element, in which the at least one contact element has at least one undercut section to fix in spatially form-fitting manner the magnetic field sensor at a support during the at least sectional injection molding process with a plastic material. Magnetic field sensor module, the magnetic field sensor module comprising a support with at least a fixing section for a magnetic field sensor and a plastic injection molding, wherein the magnetic field sensor module has at least such a magnetic field sensor and the magnetic field sensor is spatially fixed in form-fitting manner with its at least one undercut section at the at least one fixing section of the support and is injection molded with plastic material at least in sections, and a method for producing such a magnetic field sensor module, wherein the method comprises the following steps: correctly positioned arrangement of the at least one magnetic field sensor at the support, wherein the at least one magnetic field sensor with its at least one undercut (Continued)

section is arranged at the at least one fixing section, which has not yet been reshaped; reshaping the at least one fixing section to fix in spatially form-fitting manner the at least one magnetic field sensor at the support; injection molding the support at least in sections and/or the magnetic field sensor with plastic material.

20 Claims, 5 Drawing Sheets

(58) Field of Classification Search
CPC .... G01R 33/077; G01R 33/09; G01R 33/091; G01R 33/093; G01R 33/095; G01R 33/096; G01R 33/098
USPC ......... 324/207.2, 207.21, 251, 252; 327/510, 327/511; 338/32 R, 32 H; 29/593, 29/603.01
See application file for complete search history.

(56) References Cited

U.S. PATENT DOCUMENTS

| 2004/0080314 | A1* | 4/2004 | Tsujii | G01D 5/147 324/207.21 |
| 2005/0115317 | A1* | 6/2005 | Fouquet | B29C 45/1671 73/494 |
| 2005/0179557 | A1* | 8/2005 | Matsumoto | G01D 5/147 340/693.5 |
| 2012/0306484 | A1* | 12/2012 | Mizutani | G01D 5/145 324/244 |
| 2013/0057272 | A1* | 3/2013 | Lenhard | G01R 15/185 324/252 |

OTHER PUBLICATIONS

English translation of p. 8 of German Office Action dated Jul. 19, 2016 for German Patent Application No. DE 10 2016 202 192.3 (2 pages).

\* cited by examiner

MAGNETIC FIELD SENSOR WITH A ELECTRICAL CONTACT ELEMENT HAVING A UNDERCUT SECTION, MODULE WITH THE MAGNETIC FIELD SENSOR AND METHOD TO MANUFACTURE THE MODULE WITH THE MAGNETIC FIELD SENSOR

RELATED APPLICATIONS

This application claims the benefit and priority of German Patent Application DE 10 2016 202 192.3, filed Feb. 12, 2016, which is incorporated by reference herein in its entirety.

BACKGROUND

1. Technical Field

The invention relates to a magnetic field sensor having a magnetic field sensor element and at least a band-shaped electrical contact element. Furthermore, the invention relates to a magnetic field sensor module, the magnetic field sensor module comprising a support with at least a fixing section for a magnetic field sensor and a plastic injection molding. In addition, the invention relates to a method for producing a magnetic field sensor module.

2. Background Information

DE 10 2011 081 222 A1 discloses a method for producing a sensor assembly, in particular a speed sensor assembly, with a magnetic field sensor and an interacting flow guide member, wherein the following steps are performed: A) providing the flow guide element in the form of a magnetic flow conducting, in particular pin-shaped, support body; B) forming a pre-injection molding with a receptacle for the magnetic field sensor adjacent to the support body by positioning and at least partially injection molding the support body with a thermoplastic or thermosetting material; C) arranging the magnetic field sensor in the receptacle. According to DE 10 2011 081 222 A1, when injection molding with thermoplastic (thermosetting) materials structures are produced on the support body, which support the setting of contacting means or conductive elements of the magnetic field sensor and protect against a movement inside the injection molded thermosetting plastic material.

BRIEF SUMMARY

The invention is based on the objective of improving the structure and/or function of an above-mentioned magnetic field sensor. Furthermore, the invention is based on the objective of improving the structure and/or function of an above-mentioned magnetic field sensor module. In addition, the invention is based on the objective of improving an above-mentioned method.

The objective is achieved with a magnetic field sensor having a magnetic field receiving element and at least a band-shaped electrical contact element, in which the at least one contact element has at least one undercut section, to fix in spatially form-fitting manner the magnetic field sensor at a support during the at least sectional injection molding process with a plastic material.

The magnetic field sensor can be used for capturing a magnetic field qualitatively by means of physical or chemical effects or quantitatively as a measurement. The magnetic field sensor can be used for transforming the captured measurement to an electrical signal that can be processed further. The magnetic field sensor can comprise the magnetic field receiving element and peripheral element, for example, contact elements, electronic components and/or circuits. The magnetic field sensor can be media impermeable. The magnetic field sensor can be oil-proof.

The magnetic field receiving element can also be described as a sensor element. The magnetic field receiving element can have a plate-like design. The magnetic field receiving element can involve a Hall sensor. The Hall sensor can be a discreet Hall sensor. The Hall sensor can be an integrated Hall sensor. The Hall sensor can be a lateral Hall sensor. The Hall sensor can be a vertical Hall sensor sein. The Hall sensor can be a 3D Hall sensor sein. The Hall sensor can be a gradient Hall sensor.

The at least one contact element can be used for electrically contacting the magnetic field receiving element. The at least one contact element can be designed in the form of a leaf spring. The at least one electrical contact element can have lateral edges. The at least one contact element can have a first end section, which is in electrical contact with the magnetic field receiving element. The at least one contact element can have a second free end section. The at least one contact element can have a line section, located between the first end section and the second end section. The first end section and/or the second end section can be arranged in angular fashion to the line section. The at least one undercut section can be arranged at the line section.

The at least one contact element can comprise at least a first support section for fixing the magnetic field sensor in extension direction of a first axis of a Cartesian coordinate system, at least a second support section for fixing the magnetic field sensor in extension direction of a second axis of a Cartesian coordinate system and at least a third support section for fixing the magnetic field sensor in extension direction of a third axis of a Cartesian coordinate system. The first axis, the second axis and the third axis can be arranged in perpendicular fashion to each other.

The at least one undercut section can allow for a support in extension direction of three axes of a Cartesian coordinate system arranged in perpendicular fashion to each other. The at least one undercut section can be designed in the form of a recess. The at least one undercut section can have a bead-like design. The at least one undercut section can be formed as a square. The at least one undercut section can have a rectangular shape.

The at least one undercut section can be arranged laterally at the at least one electrical contact element. The at least one undercut section can be arranged at a lateral edge of the at least one electrical contact element. The at least one undercut section can be open on one side.

The at least one undercut section can be produced together with the at least one contact element. The at least one undercut section can be produced separately after the at least one contact element has been produced. The at least one undercut section can be produced in a separation process. The at least one undercut section can be produced in a punching process.

The magnetic field sensor can have a first electrical contact element. The first electrical contact element can have at least one undercut section. The magnetic field sensor can have a second electrical contact element. The second electrical contact element can have at least one undercut section. The first contact element and the second contact element can be arranged in parallel fashion to each other. The first contact element and the second contact element can be spaced from each other.

The at least one undercut section of the first contact element and the at least one undercut section of the second electrical contact element can be arranged on sides or side edges of the contact element facing each other.

The at least one undercut section of the first electrical contact and the at least one undercut section of the second electrical contact element can be arranged on sides or side edges of the contact element facing away from each other.

The undercut sections can be arranged in symmetrical fashion. The undercut sections can be arranged in asymmetrical fashion. A symmetry or asymmetry can relate to a symmetry line, which extends parallel to one side or side edge of the at least one contact element. A symmetry or asymmetry can relate to a symmetry line extending between a first contact element and a second contact element.

The at least one undercut section can form a coding system to ensure that the magnetic field sensor is correctly positioned at the support. A coding system can be formed by multiple undercut sections. The coding system can be formed by a predetermined shape and/or arrangement of the at least one undercut section. The coding system can be formed by a predetermined shape and/or arrangement of multiple undercut sections.

Furthermore, the objective of the invention is achieved with a magnetic field sensor module, which magnetic field sensor module comprises a support having at least a fixing section for a magnetic field sensor and a plastic injection molding, wherein the magnetic field sensor module has at least such a magnetic field sensor and the magnetic field sensor is spatially fixed in form-fitting manner with its at least one undercut section at the at least one fixing section of the support and is injection molded with plastic material at least in sections.

The magnetic field sensor module can be provided for use in a transmission. The transmission can be a vehicle transmission. The transmission can also be an automatic transmission. The magnetic field sensor module can be provided to interact with a rotating magnetic pulse wheel. The magnetic field sensor module can be provided for speed calculation.

The support can have a base section. The at least one fixing section can be produced from thermoplastic material at least in sections. The at least one fixing section can be produced from thermosetting material at least in sections. The at least one fixing section can be injection molded at the base section. The at least one fixing section can be plastically malleable or reshaped at least in sections. The support and the at least one contact section of the magnetic field sensor can be spatially connected in form-fitting manner. The at least one fixing section and the at least one undercut section of the at least one contact section can be connected with each other in form-fitting manner in extension direction of three axes of the Cartesian coordinate system arranged perpendicular to each other. The support and the at least one contact section can be connected with each other by reshaping the at least one fixing section. The support and the magnetic field sensor fixed in spatially form-fitting manner at the support can be injection molded with a thermoplastic material at least in sections. The support and the magnetic field sensor fixed in spatially form-fitting manner at the support can be injection molded with a thermosetting material at least in sections.

Furthermore, the objective of the invention is achieved with a method for producing such a magnetic field sensor module, wherein the method comprises the following steps: correctly positioned arrangement of the at least one magnetic field sensor at the support, wherein the at least one magnetic field sensor with its at least one undercut section is arranged at the at least one fixing section, which has not yet been reshaped; reshaping the at least one fixing section to fix in spatially form-fitting manner the at least one magnetic field sensor at the support; injection molding the support at least in sections and/or the magnetic field sensor with plastic material.

The magnetic field sensor can be arranged at its magnetic field receiving element and with its at least one contact element at the support. The at least one contact element can be mounted with its at least one undercut section designed in the form of a recess on the at least one fixing section, which has not yet been reshaped. The at least one fixing section can be reshaped at least in sections. The at least one fixing section can be reshaped at its ends to form a spatial form-fit with the at least one undercut section.

In summary and represented in different words, the invention discloses, among other things, a sensor fixation. A sensor can be mounted on a sensor support by means of a heat-staked connection. To prevent a sensor from being displaced on the sensor support during a handling process and to restrict a final free movement, it is possible to attach a notch or bead at connecting pins. The final free movement direction of the sensor is restricted by the notch / bead at the connecting pins, because the subsequent staking of a mounting bracket can result in a form-fit connection in the recessed area (undercut). This modification of the electronic components can be performed inside or outside of the connections. By means of an asymmetric arrangement, it is also possible to implement a coding system (correctly positioned arrangement).

By means of the invention, a reliable production of the magnetic field sensor can be facilitated or enabled. As a result, wastage is reduced or prevented. Production quality is increased. It is effectively prevented that the magnetic field sensor slips from the support. It is also effectively prevented that the magnetic field sensor slips during the process of injection molding with a plastic material.

Subsequently, the embodiments of the invention are described in more detail with reference to the figures. The description provides further characteristics and advantages. Concrete characteristics of the embodiments can represent general characteristics of the invention. Characteristics of these embodiments combined with other characteristics can also represent individual characteristics of the invention.

BRIEF DESCRIPTION OF THE DRAWINGS

It is shown in a schematic and exemplary manner.

DETAILED DESCRIPTION OF THE DRAWINGS AND THE PRESENTLY PREFERRED EMBODIMENTS

Figure 1:
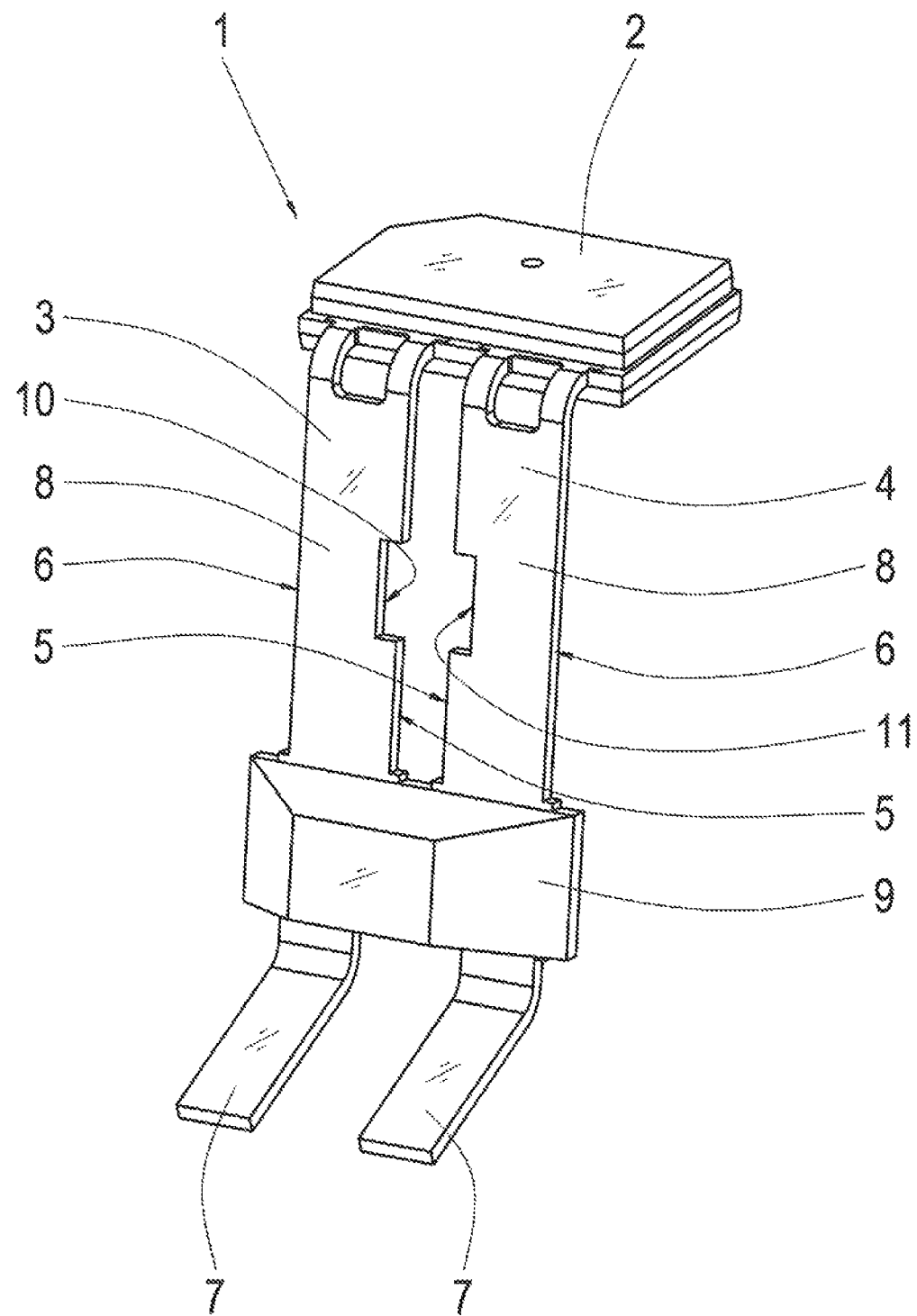
FIG. 1 is a magnetic field sensor with a magnetic field receiving element and two contact elements which have undercut sections designed in the form of recesses.

FIG. 1 shows a magnetic field sensor 1. The magnetic field sensor 1 comprises a magnetic field receiving element 2 and two electrical contact elements 3, 4. The magnetic field receiving element 2 comprises a rectangular plate-like shape. In the case at hand, the magnetic field receiving element 2 is a Hall sensor. The contact elements 3, 4 are arranged on one side of the magnetic field receiving element 2 in parallel to and spaced from each other 2. The contact elements 3, 4 are used to electrically contact the magnetic field receiving element 2.

The contact elements 3, 4 are produced from metal. For example, the contact elements 3, 4 are produced in a press-bending process. Each of the contact elements 3, 4 is designed in the form of a band or leaf spring having an inner side edge 5, an outer side edge 6, an end section on the side of the sensor, a free end section 7 and a line section 8 arranged between the end sections 7. The end sections on the side of the sensor are connected in electrically conducting manner with the magnetic field receiving element 2. The end sections on the side of the sensor and the free end section 7 extend inversely angled, respectively, starting at the line sections 8. The plate-like magnetic field receiving element 2 and the line sections 8 of the contact elements 3, 4 are arranged to each other at an angle of app. 90°. In transition areas between the line sections 8 and the end sections on the side of the sensor 3, 4 the contact elements are respectively perforated. The free end sections 7 and the line sections 8 involve an obtuse angle, respectively. A connector 9 connects the contact elements 3, 4 with each other. The connector 9 is arranged at the line sections 8 near the free end sections 7. The connector 9 is produced from plastic material.

The contact element 3 comprises an undercut section designed in the form of a rectangular recess, which is open on one side 10. The contact element 4 comprises an undercut section designed in the form of a rectangular recess, which is open on one side 11. The undercut sections 10, 11 are arranged at the line sections 8. The undercut sections 10, 11 are arranged at the inner side edges 5 of the contact elements 3, 4 facing each other. The undercut sections 10, 11 are arranged asymmetrically opposite from each other.

Figure 2:
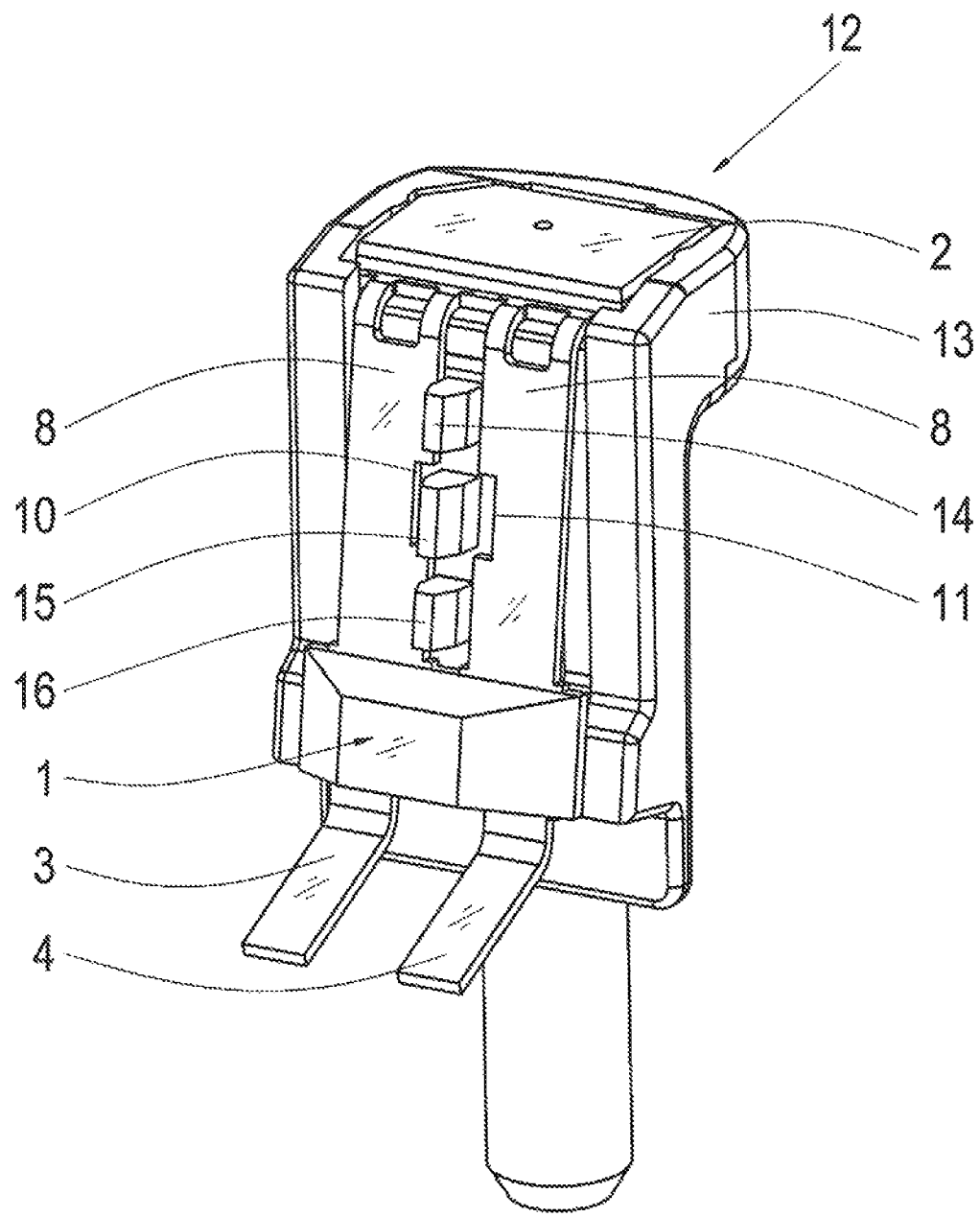
FIG. 2 is a magnetic field sensor module with a support having a fixing section, which has not yet been reshaped, and a magnetic field sensor.

FIG. 2 shows a magnetic field sensor module 12. The magnetic field sensor module 12 has a support 13 with fixing sections 14, 15, 16. The support 13 comprises a base section injection molded with a thermoplastic material. The fixing sections 14, 15, 16 are formed by means of plastic injection molding. The support 13 comprises an attachment surface for the magnetic field receiving element 2 of the contact elements 3, 4. The support 13 comprises an attachment surface for the line sections 8 of the contact elements 3, 4. The attachment surface for the magnetic field receiving element 2 and the attachment surface for the line sections 8 are arranged at least almost rectangular to each other. The fixing sections 14, 15, 16 protrude as extensions over the attachment surface for the line sections 8. The fixing sections 14, 15, 16 are arranged in a row spaced from each other. Each of the fixing sections 14, 15, 16 comprises a square cross section. Each of the fixing sections 14, 15, 16 is tapered at the end to facilitate the attachment of the contact elements 3, 4.

When producing the magnetic field sensor module 12, the magnetic field sensor 1 is arranged at the support 13 with its magnetic field receiving element 2 at the attachment surface for the magnetic field receiving element 2 and with the line sections 8 of its contact elements 3, 4 at the attachment surface for the line sections 8. As a result, the fixing sections 14, 15, 16 protrude between the spaced line sections 8 of the contact elements 3, 4 and the central fixing section 15 is arranged between the undercut sections 10, 11. FIG. 2 shows this production state in which the fixing section 15 has not yet been reshaped.

Figure 3:
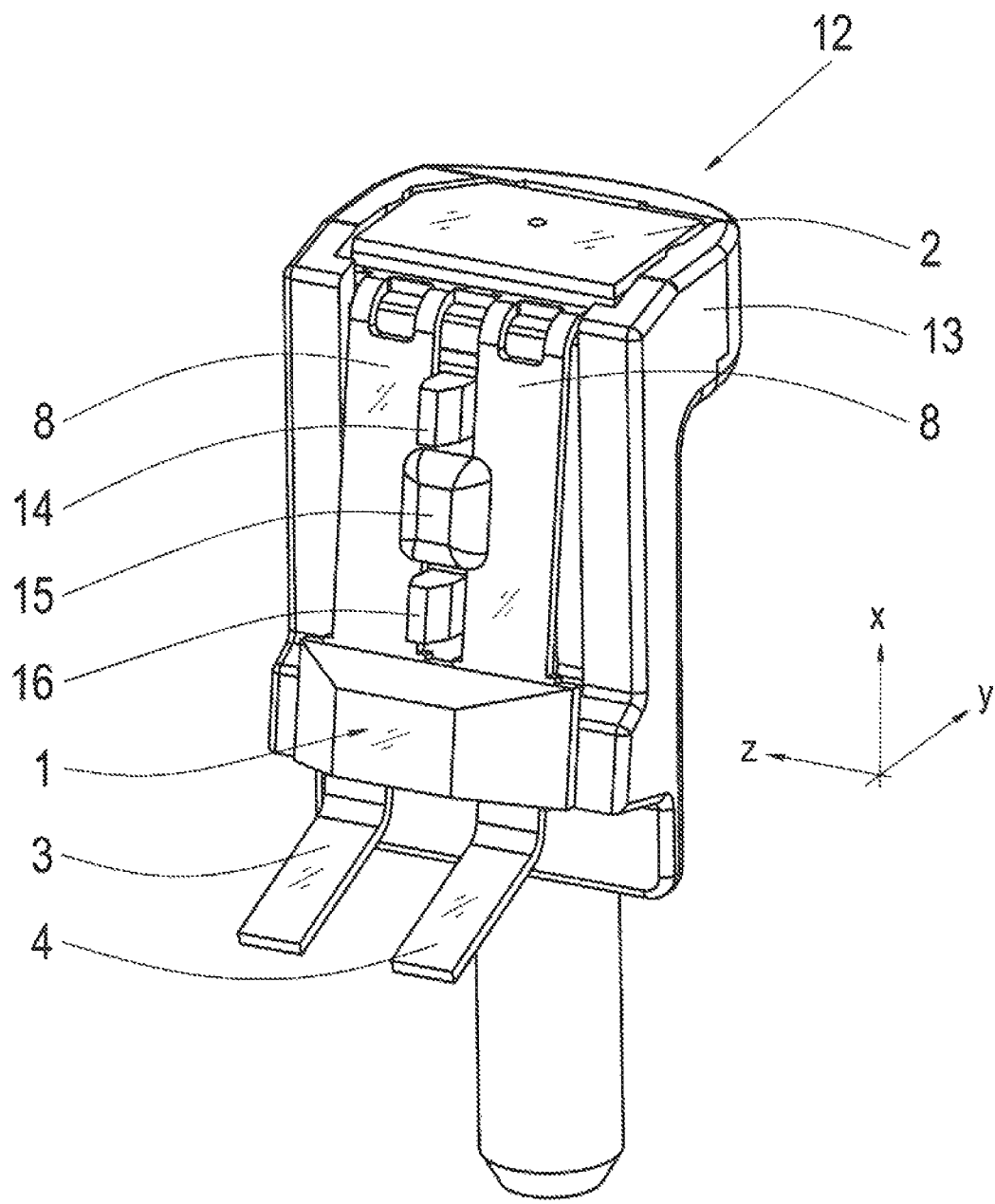
FIG. 3 is a magnetic field sensor module with a support and a magnetic field sensor spatially fixed in form-fitting manner at the support.

Subsequently, the end of the fixing section 15 is plastically reshaped to provide a permanent spatial form-fit connection between the support 13 and the magnetic field sensor 1. The reshaping process is performed in a heat-staked process. During the reshaping process, plastic material of the fixing section 15 fills the undercut sections 10, 11, thus achieving a form-fit in all three spatial directions x, y, z. FIG. 3 shows the magnetic field sensor module 12 with the support 13 and the magnetic field sensor 1 fixed in spatially form-fitting manner at the support 13 1 after the fixing section 15 is plastically reshaped.

Subsequently, the magnetic field sensor module 12 with the support 13 and magnetic field sensor 1 is injection molded in oil-proof manner with a plastic material. At the same time, the magnetic field sensor 1 is secured against displacement at the support 13 by means of the reshaped fixing section 15. The injection molded magnetic field sensor module 12 is used together with a rotating magnetic pulse wheel for speed calculation in an automatic transmission of a motor vehicle.

Figure 4:
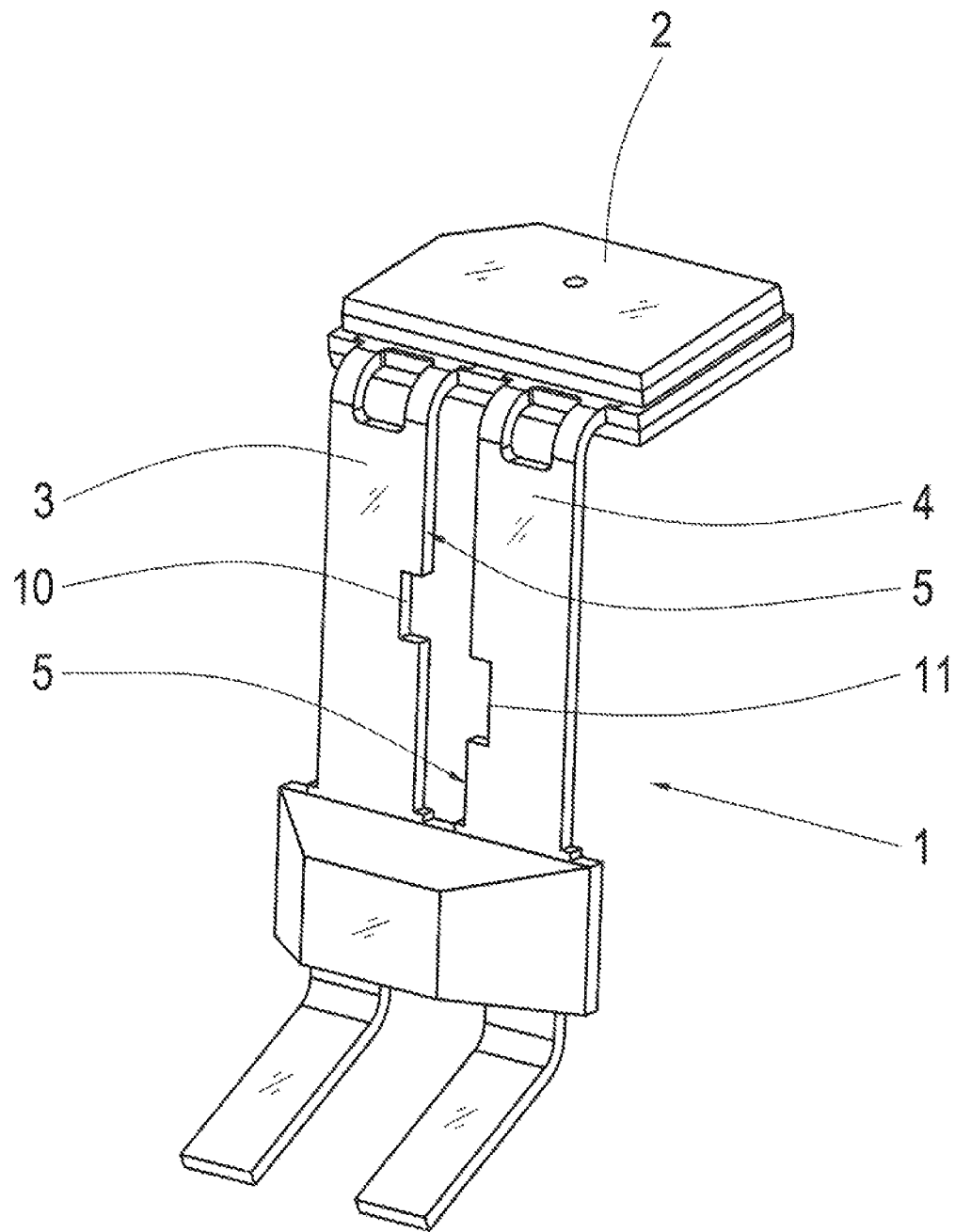
FIG. 4 is a magnetic field receiving element and two contact elements having undercut sections arranged on the inside in asymmetric manner.

FIG. 4 shows a magnetic field sensor 1 with a magnetic field receiving element 2 and two contact elements 3, 4 having undercut sections 10, 11 arranged asymmetrically on the inside. The undercut sections 10, 11 are arranged at the inner side edges 5 of the contact elements 3, 4 and are facing each other. The undercut sections 10, 11 are arranged offset in relation to each other. In addition, special reference is made to FIGS. 1 to 3, as well as to the associated description.

Figure 5:
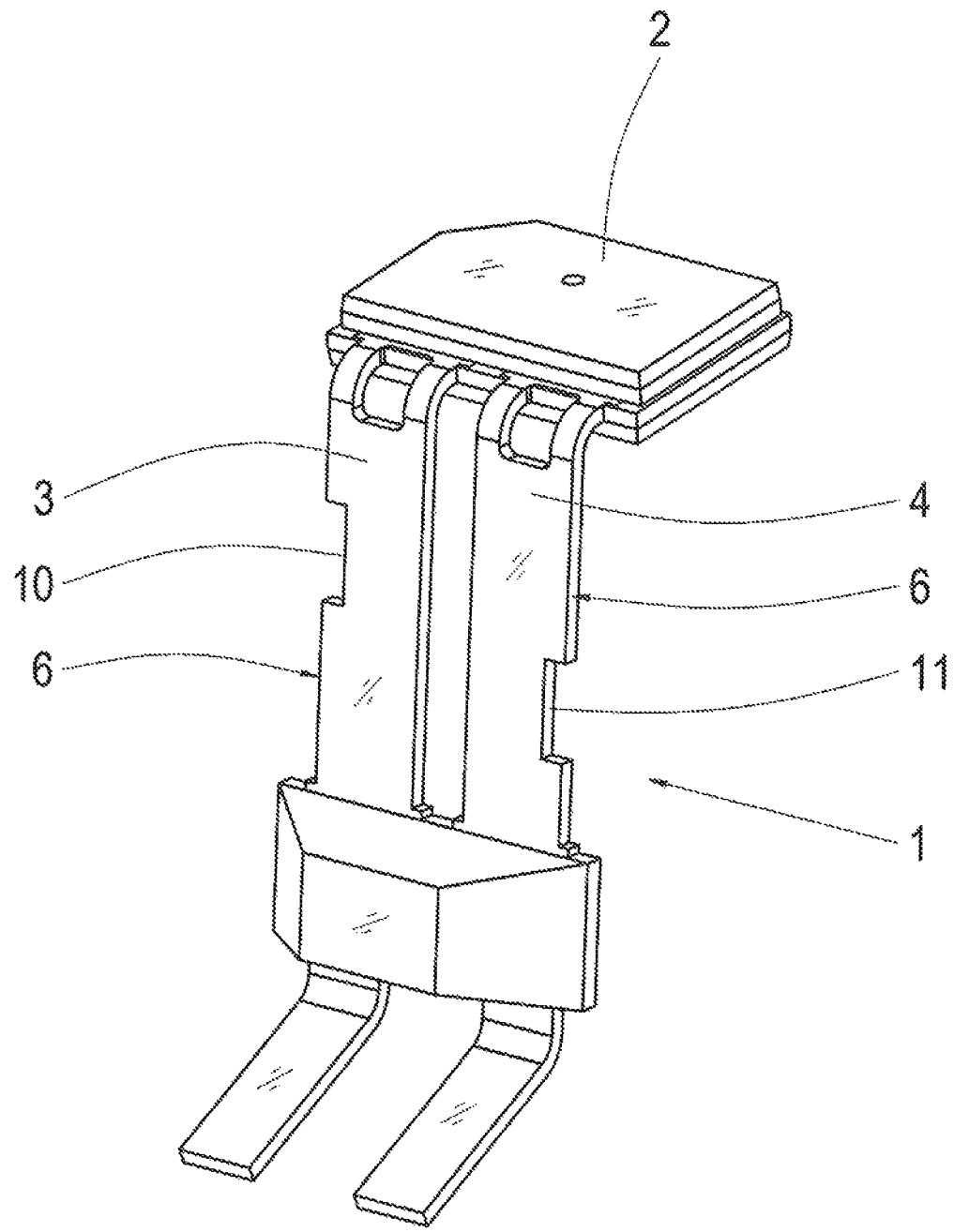
FIG. 5 is a magnetic field sensor with a magnetic field receiving element and two contact elements having undercut sections arranged on the outside in asymmetric manner.

FIG. 5 shows a magnetic field sensor 1 with a magnetic field receiving element 2 and two contact elements 3, 4 having undercut sections 10, 11 arranged asymmetrically on the outside. The undercut sections 10, 11 are arranged at the outer side edges 6 of the contact elements 3, 4 facing away from each other. The undercut sections 10, 11 are arranged offset in relation to each other. In addition, special reference is made to FIGS. 1 to 3, as well as to the associated description.

REFERENCE NUMERALS 1 magnetic field sensor
2 magnetic field receiving element
3 contact element
4 contact element
5 side edge
6 side edge
7 end section
8 line section
9 connector
10 undercut section
11 undercut section
12 magnetic field sensor module
13 support
14 fixing section
15 fixing section
16 fixing section

The invention claimed is:

1. A magnetic field sensor, the magnetic field sensor comprising:
   a magnetic field receiving element; and
   at least one band-shaped electrical contact element;
   wherein the at least one contact element comprises at least one undercut section to fix in a spatially form-fitting manner the magnetic field sensor to a support of a magnetic field sensor module, a line section and a free end section extending from the line section at an obtuse angle; and wherein the support comprises at least one section comprising a plastic injection molded material.

2. The magnetic field sensor of claim 1, wherein the at least one undercut section forms a recess.

3. The magnetic field sensor of claim 1, wherein the at least one undercut section is arranged on a lateral side of the at least one electrical contact element.

4. The magnetic field sensor of claim 1, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged on sides of the first and second electrical contact elements that face each other.

5. The magnetic field sensor of claim 1, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged at sides of the first and second electrical contact element that face away from each other.

6. The magnetic field sensor of claim 1, wherein the at least one electrical contact element comprises a first electrical contact element comprising the at least one undercut section and a second electrical contact element comprising at least one undercut section; wherein the undercut section of the first electrical contact element and the undercut section of the second electrical contact element are arranged symmetrically.

7. The magnetic field sensor of claim 1, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged asymmetrically.

8. The magnetic field sensor of claim 1, wherein the at least one undercut section forms a coding system to ensure that the magnetic field sensor is correctly positioned at the support.

9. A magnetic field sensor module, the magnetic field sensor module comprising:
 a support with at least one fixing section;
 at least one plastic injection molded section; and
 at least one magnetic field sensor comprising a magnetic field receiving element and at least one electrical contact element;
 wherein the at least one electrical contact element comprises at least one undercut section, a line section and a free end section extending from the line section at an obtuse angle; and
 wherein the at least one undercut section of the at least one magnetic field sensor is spatially fixed in a form-fitting manner to the at least one fixing section of the support.

10. A method for producing a magnetic field sensor module, the magnetic field sensor module comprising a support with at least one fixing section, at least one plastic injection molded section, and at least one magnetic field sensor comprising a magnetic field receiving element and at least one electrical contact element, the at least one electrical contact element comprising at least one undercut section, a line section and a free end section extending from the line section at an obtuse angle, the method comprising:
 arranging the at least one magnetic field sensor at the support; wherein the at least one magnetic field sensor with its at least one undercut section is arranged at the at least one fixing section;
 reshaping the at least one fixing section to fix in a spatially form-fitting manner the at least one magnetic field sensor at the support; and
 injection molding the support at least in sections and/or the magnetic field sensor with plastic material.

11. The magnetic field sensor of claim 2, wherein the at least one undercut section is arranged on a lateral side of the at least one electrical contact element.

12. The magnetic field sensor of claim 2, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged on sides of the first and second electrical contact elements that face each other.

13. The magnetic field sensor of claim 3, wherein the at least one electrical contact element comprises a first electrical contact element comprising the at least one undercut section and a second electrical contact element comprising at least one undercut section; wherein the at least one undercut section of the first element contact element and the at least one undercut section of the second electrical contact element are arranged on sides of the first and second electrical contact elements that face each other.

14. The magnetic field sensor of claim 2, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged at sides of the first and second electrical contact element that face away from each other.

15. The magnetic field sensor of claim 3, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged at sides of the first and second electrical contact element that face away from each other.

16. The magnetic field sensor of claim 2, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged symmetrically.

17. The magnetic field sensor of claim 3, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged symmetrically.

18. The magnetic field sensor of claim 2, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged asymmetrically.

19. The magnetic field sensor of claim 3, wherein the at least one electrical contact element comprises a first electrical contact element comprising the at least one undercut section and a second electrical contact element comprising at least one undercut section; wherein the at least one undercut section of the first electrical contact element and the at least one undercut section of the second electrical contact element are arranged asymmetrically.

20. The magnetic field sensor of claim 2, wherein the at least one undercut section forms a coding system to ensure that the magnetic field sensor is correctly positioned at the support.

\* \* \* \* \*